United States Patent
Kwon

(10) Patent No.: US 8,022,462 B2
(45) Date of Patent: Sep. 20, 2011

(54) METHODS OF FORMING SHALLOW TRENCH ISOLATION STRUCTURES WITH BURIED BIT LINES IN NON-VOLATILE MEMORIES

(75) Inventor: Wook Hyun Kwon, Kyung-Ki Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 513 days.

(21) Appl. No.: 12/109,761

(22) Filed: Apr. 25, 2008

(65) Prior Publication Data
US 2008/0265303 A1 Oct. 30, 2008

(30) Foreign Application Priority Data
Apr. 27, 2007 (KR) .......................... 10-2007-0041430

(51) Int. Cl.
*H01L 29/788* (2006.01)
(52) U.S. Cl. ........... 257/315; 257/E21.54; 257/E29.001; 257/754; 257/E23.141; 438/423; 438/257; 438/264; 438/266
(58) Field of Classification Search ............. 257/754, 257/E23.141, 315, E21.54, E29.001; 438/151, 438/264, 423, 257, 266
See application file for complete search history.

(56) References Cited

U.S. PATENT DOCUMENTS

| | | | |
|---|---|---|---|
| 5,526,307 A | 6/1996 | Yiu et al. | |
| 6,436,751 B1 | 8/2002 | Liou et al. | |
| 6,858,906 B2 | 2/2005 | Lee et al. | |
| 7,072,214 B2 | 7/2006 | Jeong et al. | |
| 7,184,291 B2 * | 2/2007 | Bollu et al. | 365/63 |
| 7,811,887 B2 * | 10/2010 | Irani et al. | 438/262 |
| 2004/0169238 A1 | 9/2004 | Lee et al. | |
| 2004/0209424 A1 * | 10/2004 | Suzuki et al. | 438/257 |
| 2005/0064662 A1 | 3/2005 | Yang et al. | |
| 2006/0180851 A1 | 8/2006 | Lee et al. | |
| 2008/0025084 A1 * | 1/2008 | Irani et al. | 365/184 |
| 2009/0085213 A1 * | 4/2009 | Higashi et al. | 257/754 |

FOREIGN PATENT DOCUMENTS

| | | |
|---|---|---|
| JP | 10-050965 | 2/1998 |
| KR | 10-2000-0076517 A | 12/2000 |
| KR | 10-2003-0054274 A | 7/2003 |
| KR | 10-2007-0038233 A | 4/2007 |

* cited by examiner

*Primary Examiner* — Matthew Smith
*Assistant Examiner* — Wilner Jean Baptiste
(74) *Attorney, Agent, or Firm* — Myers Bigel Sibley & Sajovec, P.A.

(57) ABSTRACT

Methods of forming buried bit lines in a non-volatile memory device can include forming impurity regions in a substrate of a non-volatile memory device to provide immediately neighboring buried bit lines for the device and then forming a shallow trench isolation region in the substrate between the immediately neighboring buried bit lines to substantially equalize lengths of the immediately neighboring buried bit lines.

12 Claims, 22 Drawing Sheets

Fig. 24B

|  | Program | Erase | Read |
|---|---|---|---|
| BL(Select) | 4V | Floating | 0.6V |
| WL(Select) | 2~7V | -9V | 2~7V |
| C/S | 0V | Floating | 0V |
| BL (Un-Select) | 0V | Floating | 0V |
| WL (Un-Select) | 0V | Floating | 0V |
| Bulk | -0.5~-1.0 | +10V | 0V |

METHODS OF FORMING SHALLOW TRENCH ISOLATION STRUCTURES WITH BURIED BIT LINES IN NON-VOLATILE MEMORIES

CROSS-REFERENCE TO RELATED APPLICATIONS

This application claims priority from Korean Patent Application No. 10-2007-0041430, filed on Apr. 27, 2007, in the Korean Intellectual Property Office, the disclosure of which is incorporated herein by reference in its entirety.

FIELD OF THE INVENTION

The present invention relates to the field of electronics, and more particularly, to methods of forming non-volatile memories and the devices so formed.

BACKGROUND

Non-volatile memory devices are widely used in various kinds of electronic products such as mobile telephones, etc. One type of non-volatile memory that has become popular is what is commonly referred to as NOR type flash memory. It is recognized that in conventional NOR flash memory, the metal contact employed in source/drain regions may use a significant area of the integrated circuit. Accordingly, one approach, sometimes referred to as buried bit line, has been used to avoid the formation of contacts in NOR type flash memory.

Non-volatile memories are also discussed in, for example, U.S. Patent Publication No. 2004/0169238 A1 to Lee et al., U.S. Patent Publication No. 2006/0180851 A1 to Lee et al., U.S. Pat. No. 5,526,307 to Yiu et al., U.S. Pat. No. 6,858,906 B2 to Lee et al. and U.S. Pat. No. 7,072,214 B2 to Jeong et al.

SUMMARY

Embodiments according to the invention can provide methods of forming shallow trench isolation structures with buried bit lines in non-volatile memories and devices, cards, and systems so formed. Pursuant to these embodiments, methods of forming buried bit lines in a non-volatile memory device can include forming impurity regions in a substrate of a non-volatile memory device to provide immediately neighboring buried bit lines for the device and then forming a shallow trench isolation region in the substrate between the immediately neighboring buried bit lines to substantially equalize lengths of the immediately neighboring buried bit lines.

Accordingly, shallow trench isolation structures can be formed self aligned to, for example, impurity regions that provide the buried bit line structures and NOR type flash memories. In particular, forming the shallow trench isolation structures so that they are self aligned to structures that provide the buried bit line of the non-volatile memory (i.e., the impurity regions) can help to substantially equalize ranks of the associated impurity regions (i.e., the lengths of the bit lines). For example, the formation of the self aligned shallow trench isolation structures can help to remove portions of the impurity regions which may have otherwise been formed misaligned by a conventional photolithographic process. As appreciated by the present inventors, using a photolithographic process to form the shallow trench isolation structures separate from the formation of the impurity regions to provide the buried bit lines can lead to misalignment errors thereby increasing the possibility of forming bit lines with different lengths within the same memory sector.

BRIEF DESCRIPTION OF THE DRAWINGS

FIG. 24B is a table that illustrates typical operating parameters associated with NOR type flash memories formed according to embodiments of the present invention.

DESCRIPTION OF EMBODIMENTS ACCORDING TO THE INVENTION

Figure 1:
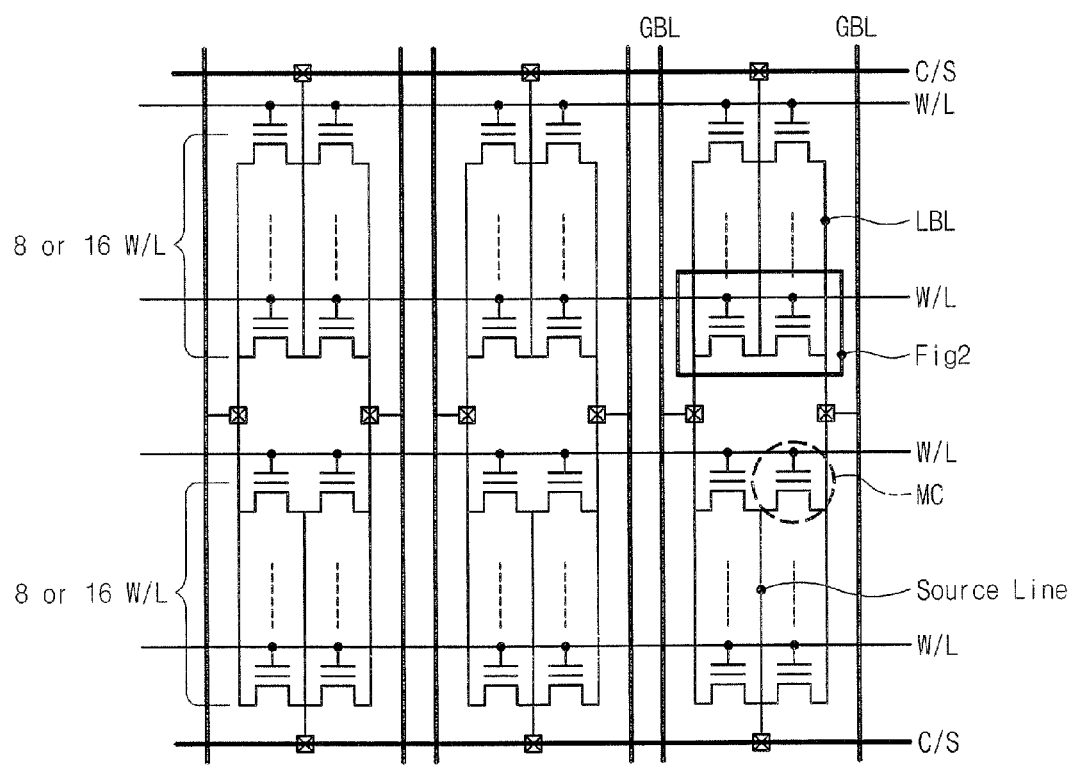
FIG. 1 is a schematic illustration of an equivalent circuit representing a NOR type flash memory array in some embodiments according to the invention.

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. Moreover, each embodiment described and illustrated herein includes its complementary conductivity type embodiment as well.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting or" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

As described herein below in greater detail, shallow trench isolation structures can be formed self aligned to, for example, impurity regions that provide the buried bit line structures and NOR type flash memories. In particular, forming the shallow trench isolation structures so that they are self aligned to structures that provide the buried bit line of the non-volatile memory (i.e., the impurity regions) can help to substantially equalize ranks of the associated impurity regions (i.e., the lengths of the bit lines). For example, the formation of the self aligned shallow trench isolation structures can help to remove portions of the impurity regions which may have otherwise been formed misaligned by a conventional photolithographic process. As appreciated by the present inventors, using a photolithographic process to form the shallow trench isolation structures separate from the formation of the impurity regions to provide the buried bit lines can lead to misalignment errors thereby increasing the possibility of forming bit lines with different lengths within the same memory sector.

In further embodiments according to the invention, the impurity regions can be formed before the shallow trench isolation structures. In particular, the impurity regions may be formed in the substrate to provide immediately neighboring buried bit lines for the device. After the formation of the impurity region (i.e., the buried bit lines), a shallow trench isolation region can be formed in the substrate between the immediately neighboring buried bit lines. As appreciated by the present inventors, this approach can substantially equalize what may be otherwise different lengths of the immediately neighboring buried bit lines, which may be generated by conventional approaches. For example, as appreciated by the present inventors, if the shallow trench isolation structure is formed in the substrate using a standard photolithographic process (e.g., before the formation of the impurity regions), the subsequent formation of the impurity regions can be misaligned relative to the shallow trench isolation structures previously formed. Accordingly, this misalignment can lead to impurity regions (ultimately providing the buried bit lines) having different lengths.

FIG. 1 is a schematic illustration of an equivalent circuit including a NOR type flash memory array in some embodiments according to the invention. In particular, FIG. 1 shows immediately neighboring memory cells (MC) each having respective local bit lines (LBL) for the two separate groupings of rows (i.e., 8-16 rows of memory cells) which are combined and provided as a global bit line (GBL). Further, the immediately neighboring memory cells (MC) share a source line (within each of the separated rows), which is provided to a common source line (C/S). Each of the rows of memory cells is coupled to a word line (W/L), which can be used to access selected memory cells.

Figure 2:
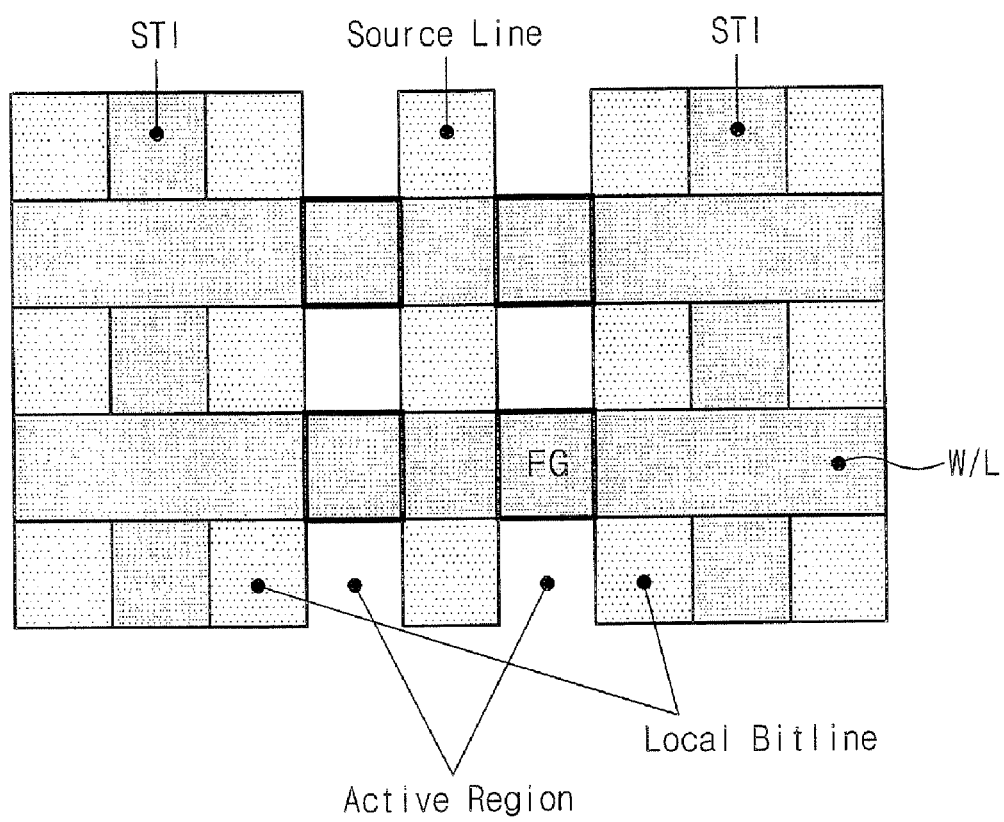
FIG. 2 is a schematic representation of a layout of a highlighted area of the NOR type flash memory array shown in FIG. 1 in some embodiments according to the invention.

FIG. 2 illustrates a schematic layout of a pair of immediately neighboring memory cells (MC) shown in FIG. 1 is some embodiments according to the invention. In particular, FIG. 2 shows a pair of immediately neighboring memory cells (MC) where the source line bisects the active regions used by the immediately neighboring memory cells (MC). Further, the floating gates of the immediately neighboring memory cells (MC) are each coupled to a word line (W/L). Bit lines of the immediately neighboring memory cells (MC) are also insulated from one another by self aligned shallow trench isolation structures (STI).

Figure 3:
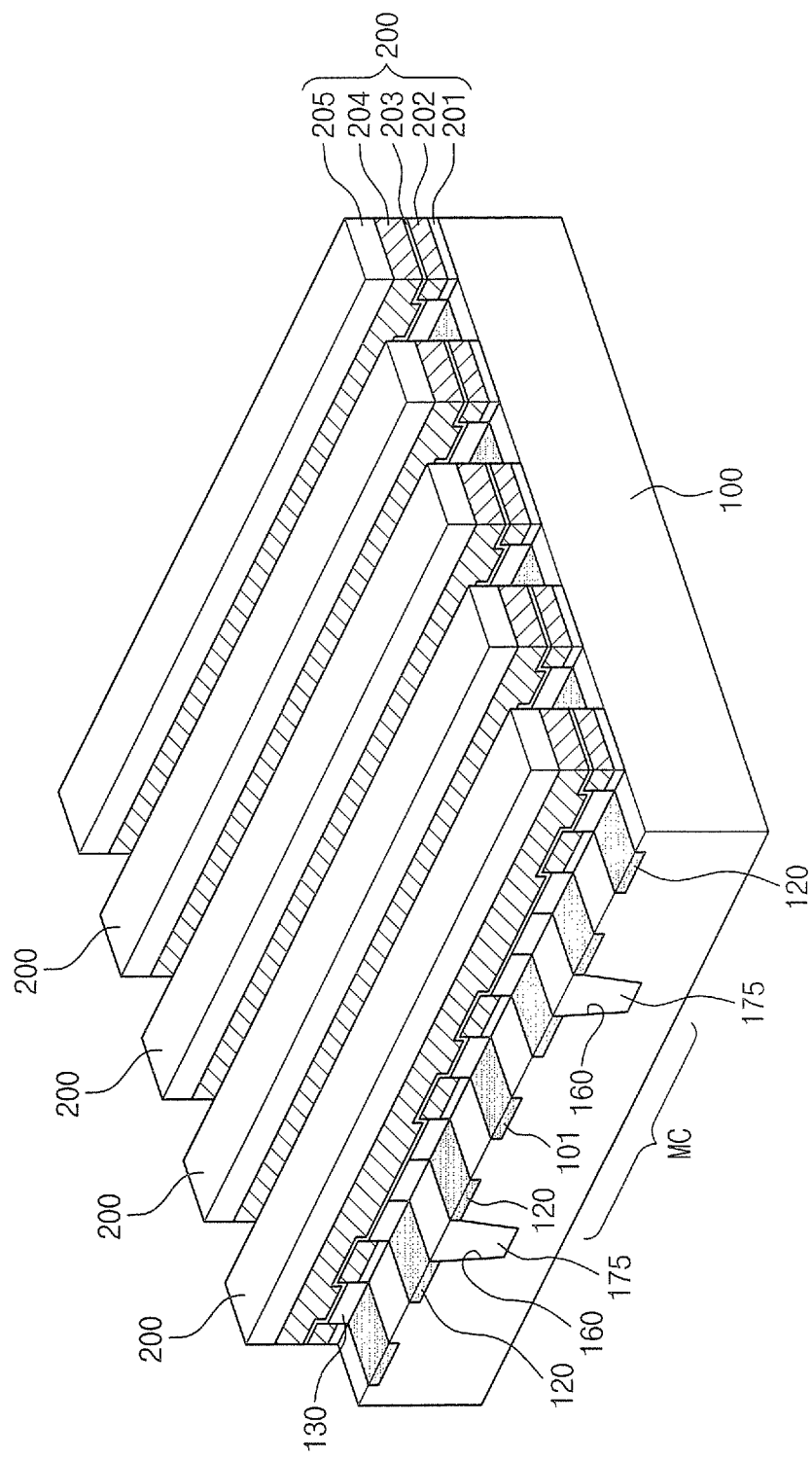
FIG. 3 is a perspective view of a NOR type flash memory device including buried bit lines with self aligned shallow trench isolation structures formed therein in some embodiments according to the invention.

FIG. 3 is a perspective view illustrating a NOR type flash memory including buried bit lines and self-aligned shallow trench isolation structures in some embodiments according to the invention. As shown in FIG. 3, a central region of a substrate 100 includes the immediately neighboring memory cells (MC) shown in FIGS. 1 and 2. In particular, a gate pattern 200 is provided on the active region in the substrate 100 for both of the immediately neighboring memory cells (MC). Immediately neighboring memory cells (MC) share a source line 101 located between the respective gate thereof. Further, buried bit lines 120 associated with each of the immediately neighboring memory cells MC are provided by impurity regions formed within the substrate 100. As further shown in FIG. 3, immediately neighboring buried bit lines 120 located between immediately neighboring memory cells (MC) are separated by a self-aligned shallow trench isolation structure pattern 160.

As further shown in FIG. 3, the gate pattern 200 coupled to each of the immediately neighboring memory cells (MC) includes a number of layers. In particular, each of the gate patterns 200 can include a gate insulating pattern 201, a floating gate pattern 202 formed thereon, an inter-gate dielectric layer formed thereon, a control gate pattern formed thereon, and a hard mask pattern 205. It will be understood that the control gate pattern 204 can provide the word line (W/L) described above in reference to FIGS. 1 and 2.

FIGS. 4-13 are perspective views that illustrate methods of forming a NOR type flash memory with buried bit lines and self aligned shallow trench isolation structures in some embodiments according to the invention. According to FIG. 4, a lower pattern 110 is formed on the substrate 100. The lower pattern 110 can be provided by forming a series of layers on the substrate 100 followed by either separately patterning each of the layers or patterning the complete collection of layers together.

Figure 4:
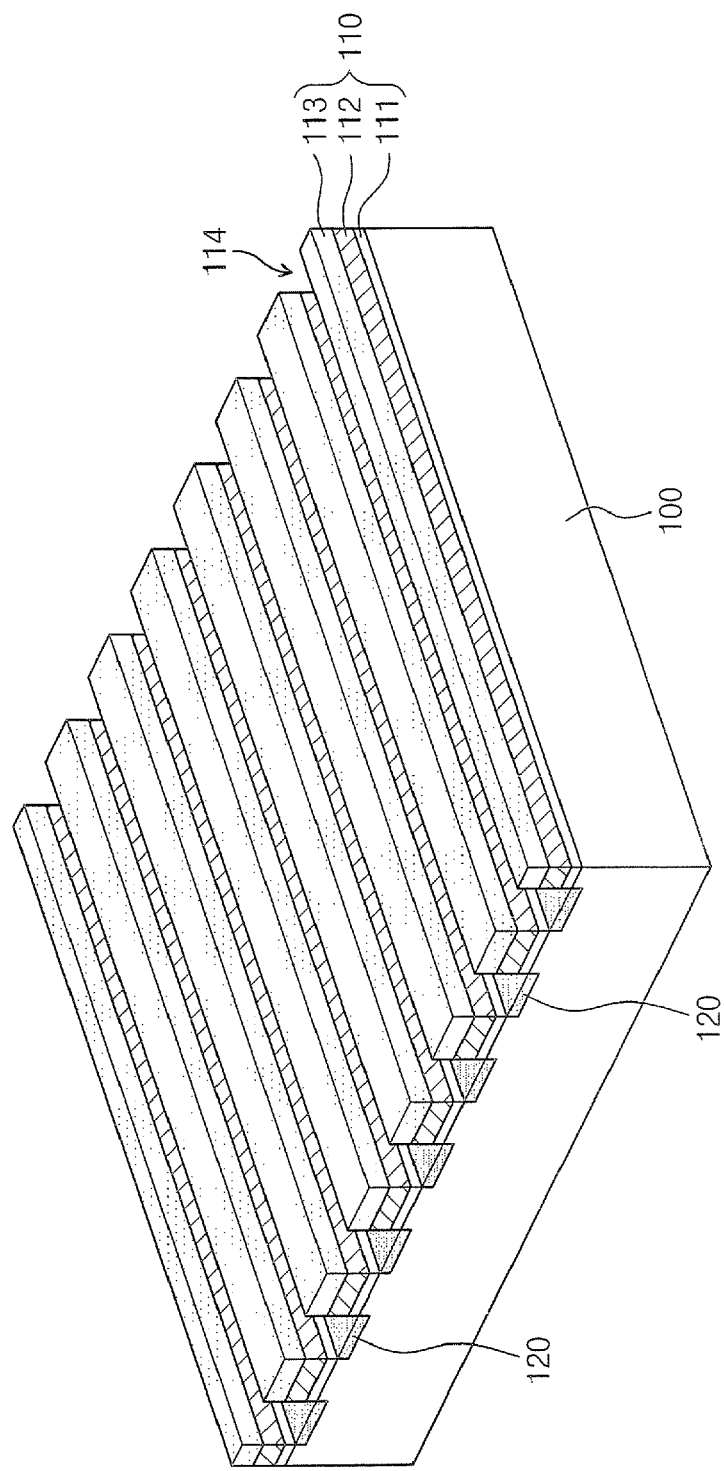
FIGS. 4-13 are perspective views that illustrate methods of forming a NOR type flash memory including buried bit lines in self aligned shallow trench isolation structures in some embodiments according to the invention.

According to FIG. 4, the lower pattern 110 includes a gate insulating pattern 111, a lower conductive pattern 112 formed thereon, and the capping pattern 113 formed on the lower conductive pattern 112. In some embodiments according to the invention, the gate insulating pattern 111 can be SiO2, SiON, and/or a high-K material. In some embodiments according to the invention, the lower conductive pattern 112 can be any conductive material, such as polysilicon. In some embodiments according to the invention, the capping pattern 113 may be silicon nitride.

The layers described above are patterned to provide pluralities of openings 114 to define the lower pattern 110. Accordingly, the openings 114 expose respective portions of the substrate 100. Impurities are implanted into the exposed portions of the substrate 100 via the openings 114 to form impurity regions 120. It will be understood that the impurity regions 120 can provide buried bit lines for the NOR type flash memory in some embodiments according to the invention.

Figure 5:
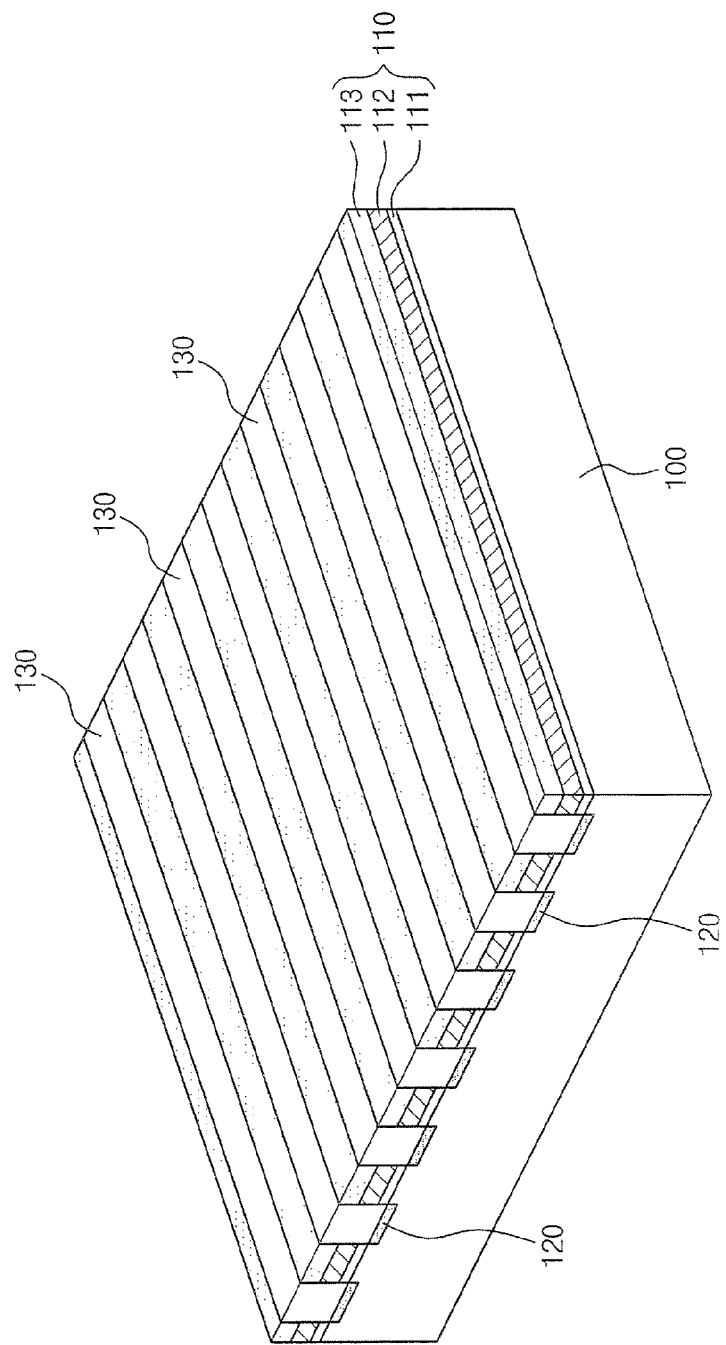

According to FIG. 5, a dielectric material 130 is formed on the substrate 100 including in the openings 114 to cover the impurity regions 120. In some embodiments according to the invention, the deposition of the dielectric material 130 is limited to the openings 114. In other embodiments according to the invention, the dielectric material 130 fills the openings 114 and is deposited on an upper surface of the lower pattern 110 and is subsequently planarized to again expose the upper surface of the lower pattern.

Figure 6:
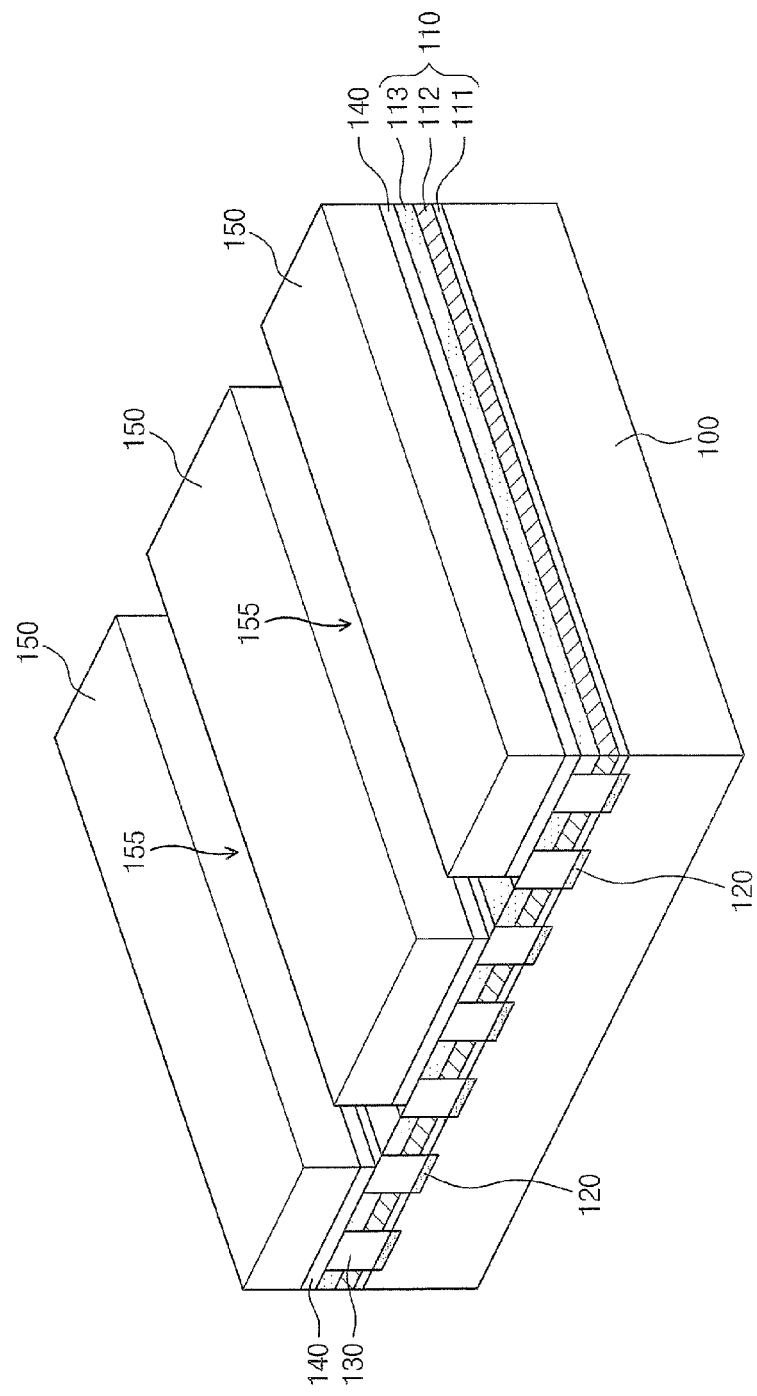

According to FIG. 6, a photo-resist pattern 150 is formed on the lower pattern to have openings 155 therein. In some embodiments according to the invention, the photo-resist pattern 150 having the openings 155 can be formed on a mask pattern 140. As shown in FIG. 6, the openings 155 are formed above the regions of the substrate that lie between selective ones of the impurity regions 120 that have the dielectric layers thereon. For example, the openings 155 are formed above regions of the substrate 100 wherein the self aligned shallow trench isolation structures are to be formed. Accordingly, the openings 155 should be formed between immediately neighboring local bit lines provided by the impurity regions 120. In some embodiments according to the invention, the mask pattern 140 and photo resist pattern 155 are formed using conventional photo lithographic processes.

Figure 7:
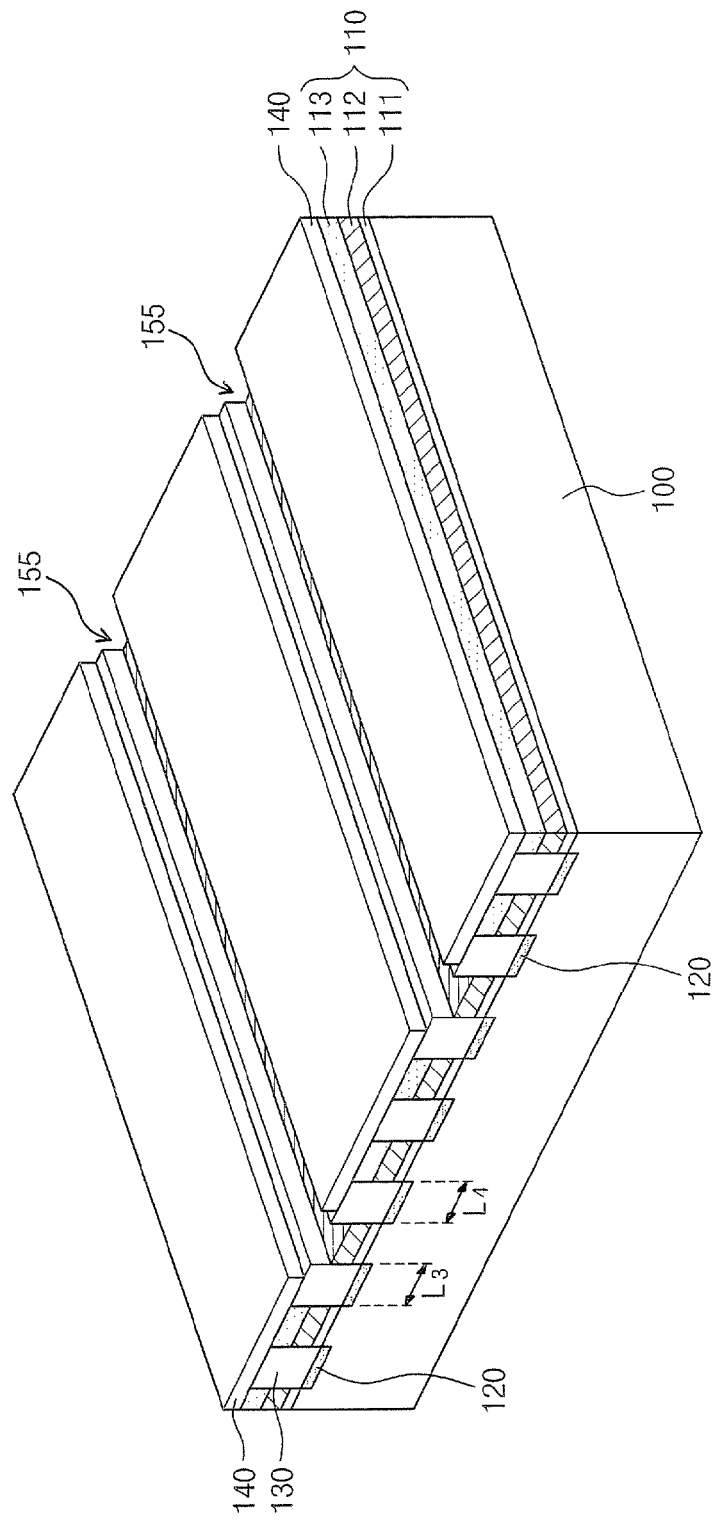

According to FIG. 7, selected portions of the lower pattern 110 are removed via the openings 155 to expose sidewalls of the dielectric layers 130 to which the shallow trench isolation structures are to be self aligned in the substrate 100. As further shown in FIG. 7, and as appreciated by the present inventors, the respective lengths, $L_3$ and $L_4$, of the different impurity regions 120 can be unequal.

Figure 8:
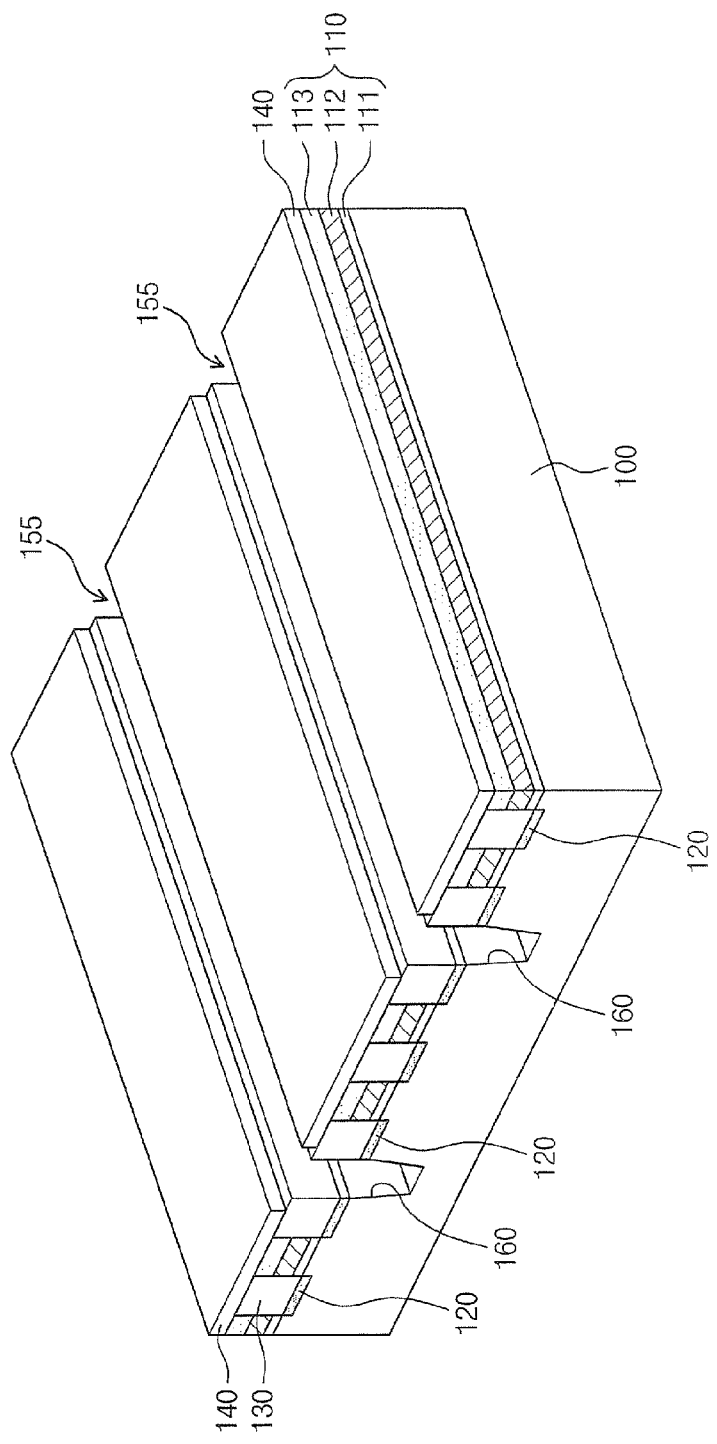

As shown in FIG. 8, portions of the substrate 100 underlying the openings 155 and having respective portions of the lower pattern 110 formed thereon are etched to form self aligned trenches 160 and the substrate 100. The self aligned trenches 160 are self aligned to the sidewalls of the dielectric layers 130 formed thereon the impurity regions 120 to ultimately provide the buried bit line structures for immediately neighboring pairs of memory cells (MC). Further, because of the self aligned nature of the trench 160, the respective lengths of the immediately adjacent impurity regions 120 can be substantially equalized.

Figure 9:
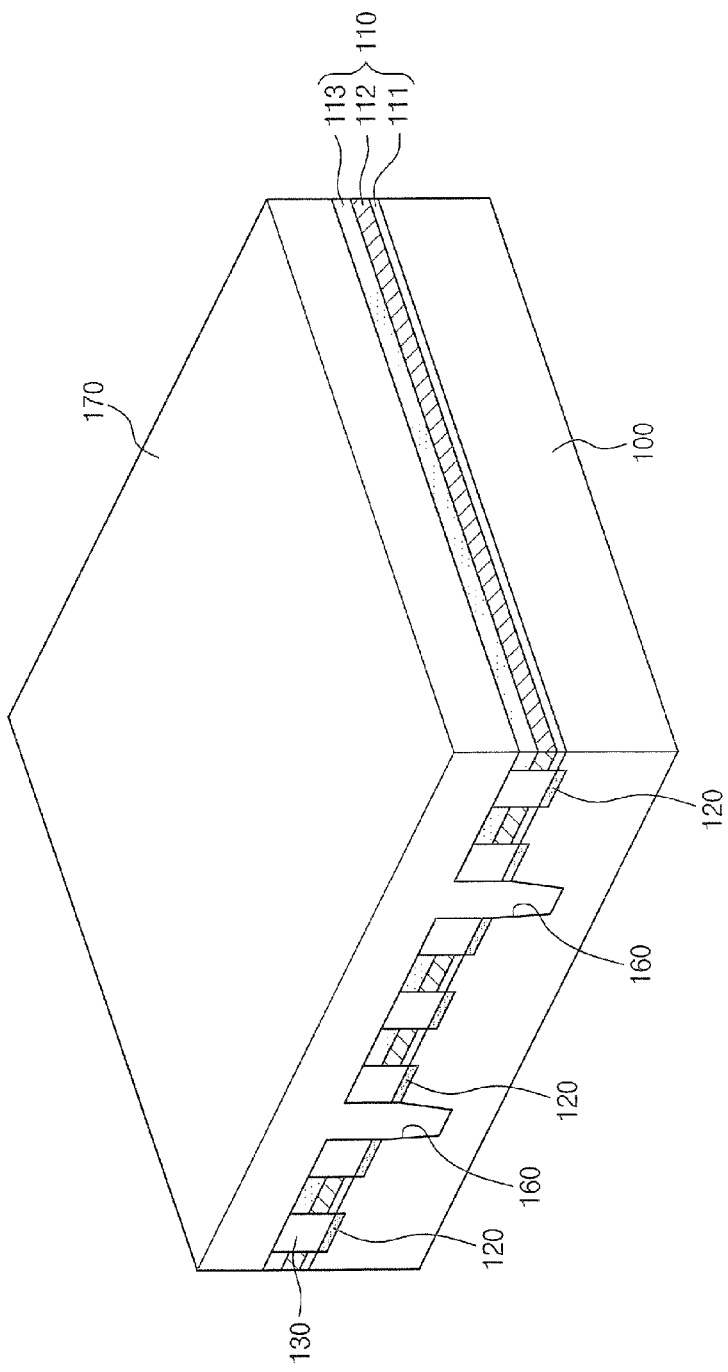

According to FIG. 9, an isolation layer 170 is formed on the upper surface of the lower pattern 110 and in self aligned trenches 160. In some embodiments according to the invention, the isolation layer 170 can be HDP, SOG, MTO, HTO, and/or undoped SiGe. In some embodiments according to the invention, the mask pattern 140 described above in reference to FIGS. 6 and 7 may remain beneath the isolation layer 170 rather than be removed.

Figure 10:
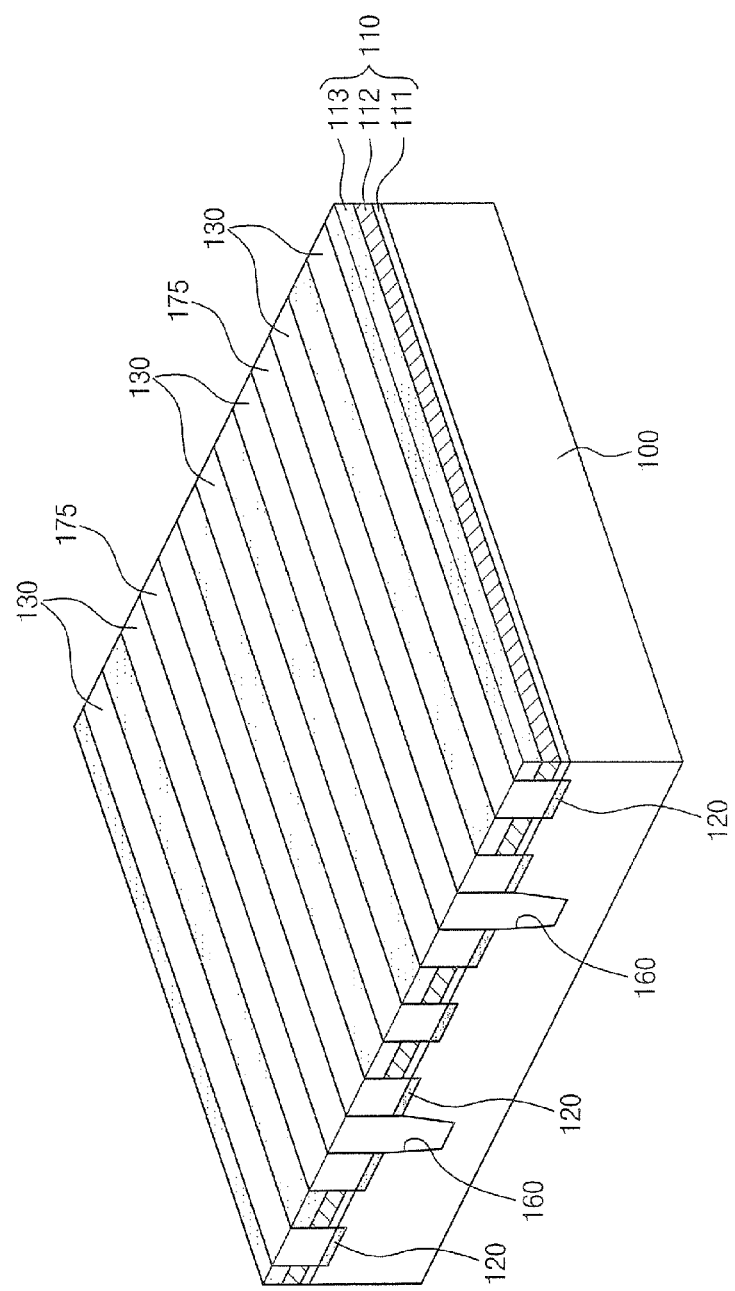

According to FIG. 10, the portion of the isolation layer 170 remaining on the upper surface of the lower pattern 110 is removed to once again expose the upper surface of the lower pattern 110. Accordingly, as shown in FIG. 10, the deposition of the isolation layer 170 in the self aligned trench 160 provides for the formation of self aligned shallow trench isolation structures 175.

Figure 11:
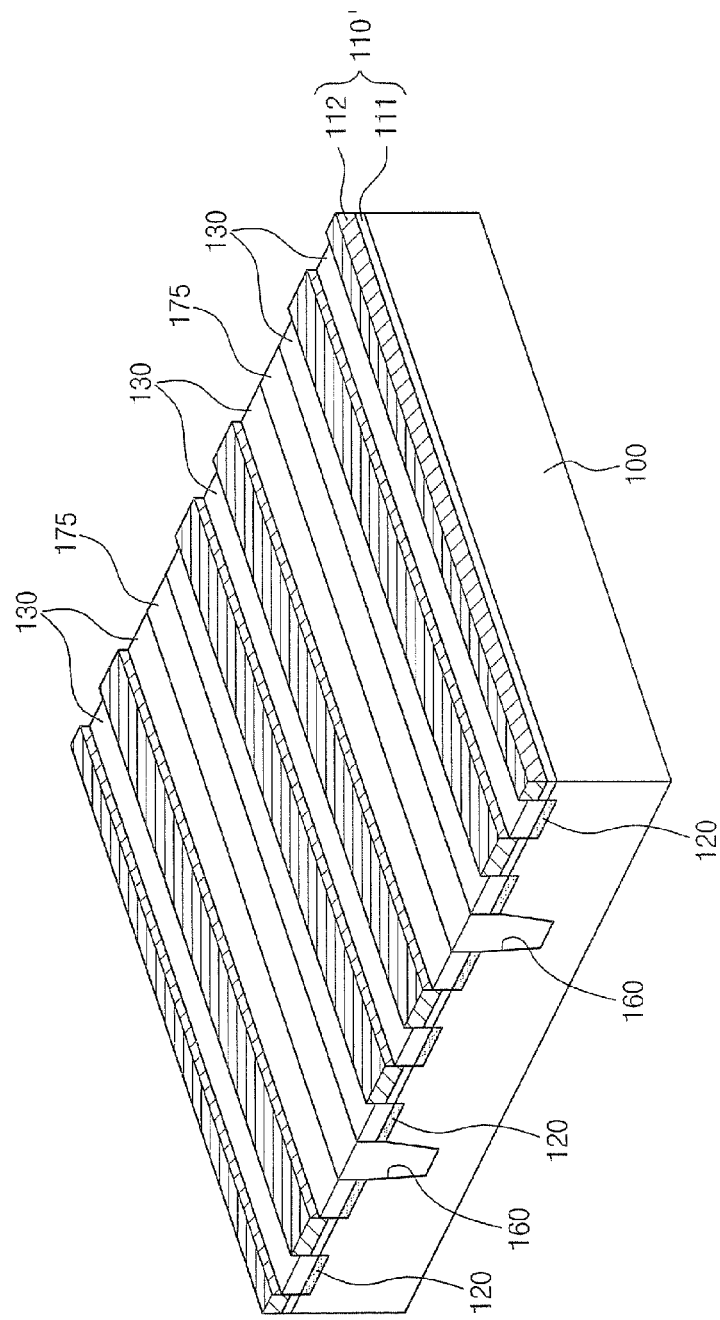

According to FIG. 11, the capping layer 113 included in the lower pattern 110 is removed to expose upper surface of the lower conductive pattern 112. The dielectric layer 130 is recessed (along with the isolation material 175) to expose side walls of the lower conductive pattern 112 above the impurity regions 120 that provide the buried bit lines. As further shown in FIG. 11, a portion of the dielectric layer 130 remains on the impurity regions 120 to reduce any subsequent coupling between an upper conductive layer and the impurity regions 120.

Figure 12:
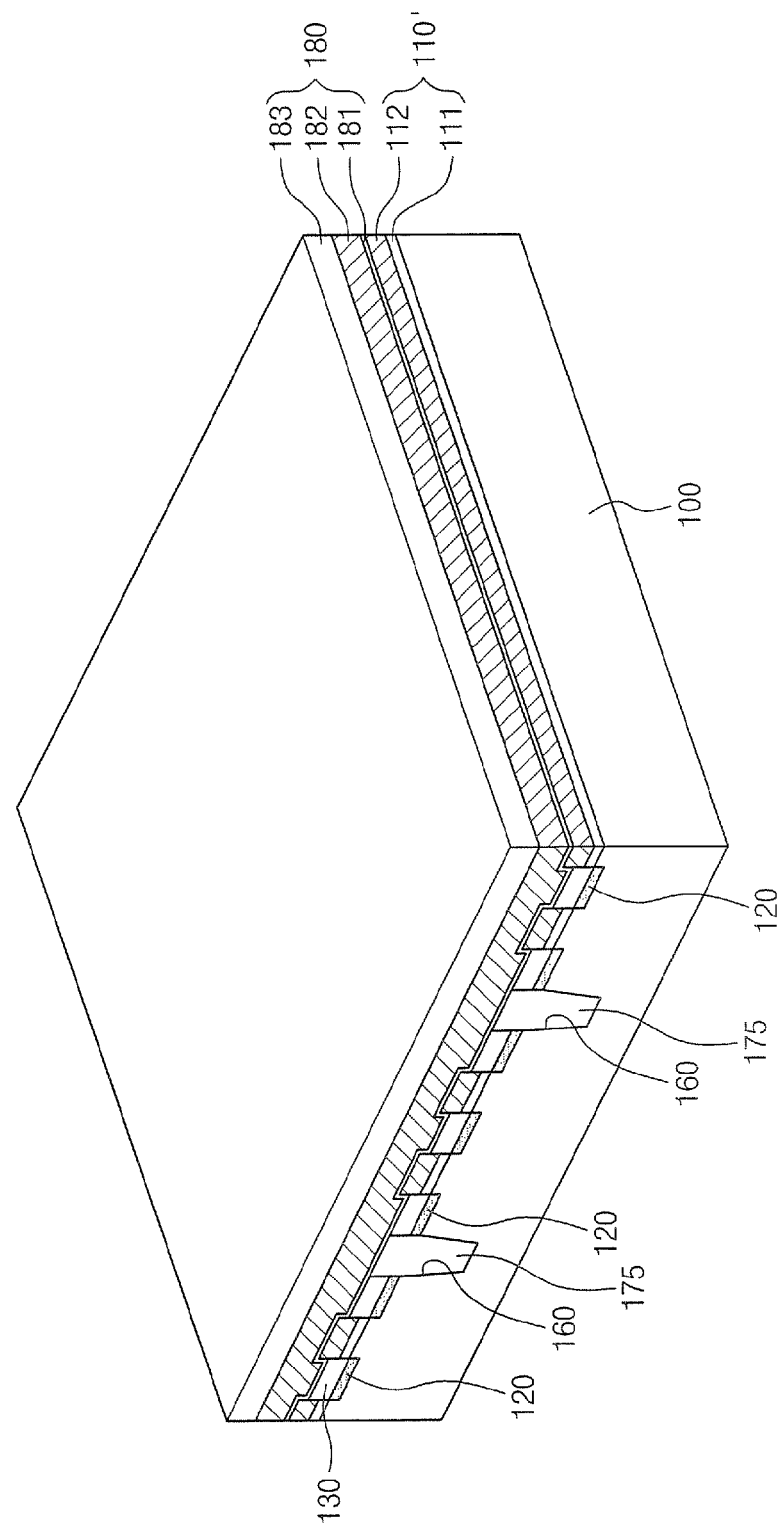
Figure 13:
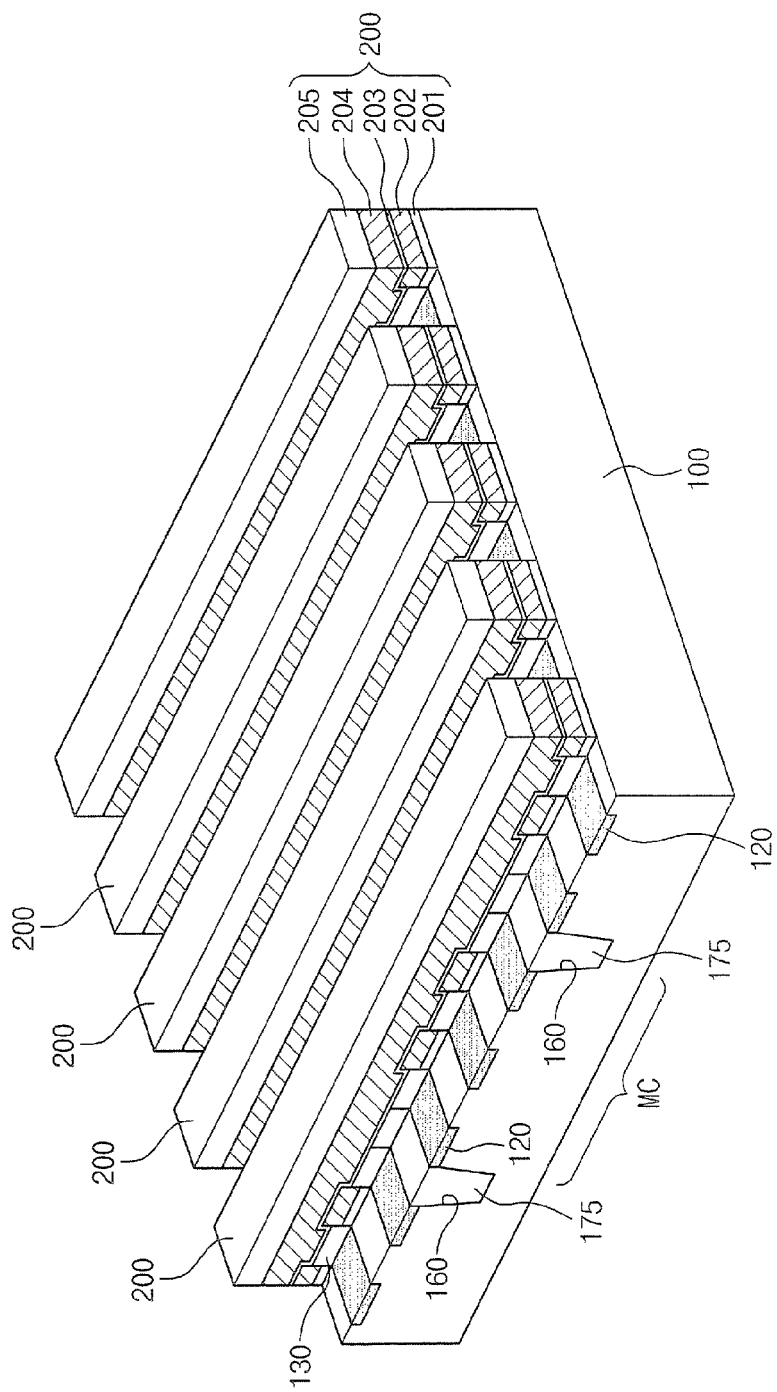

According to FIG. 12, an upper layer 180 is formed on the lower conductive pattern 112. The upper layer 180 includes an intergate dielectric layer 181 formed on the lower conductive layer 112, an upper conductive layer 182 formed on the intergate dielectric layer 181, and an upper hard mask layer 183 formed on the upper conductive layer 182. In some embodiments according to the invention, the upper conductive layer can be polysilicon, silicide, metal and/or a multilayered upper conductive layer including any of these materials or combinations thereof. In some embodiments according to the invention, the intergate dielectric layer can be SiOx/SxiNy/SiOx, SiOx, SixNy, Al2O3, HfAlOx, HfAlON, HfSiOx, HfSiON. According to FIG. 13, the upper layer is patterned to provide an upper layer pattern 200 that can provide word lines for the memory cells (MC).

Figure 14:
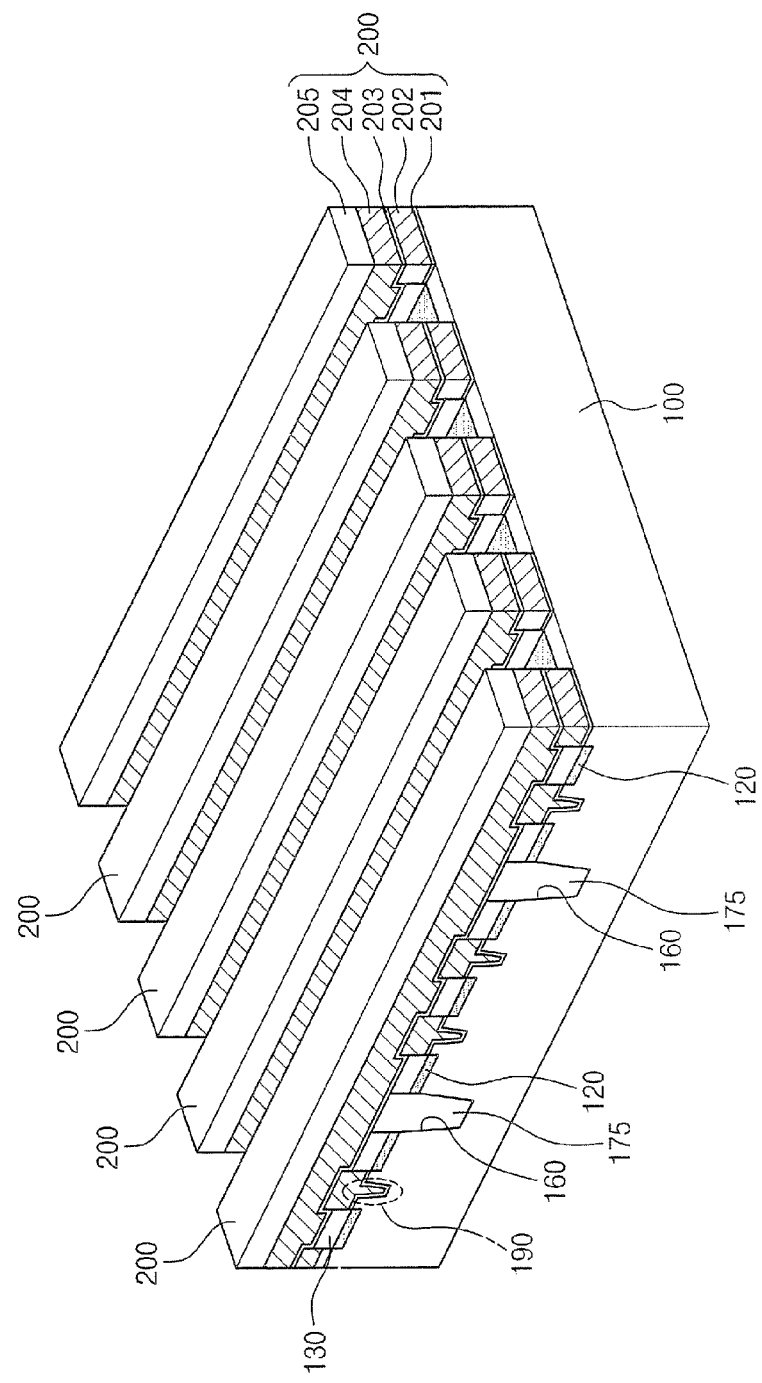
FIG. 14 is a perspective view of a NOR type flash memory including buried bit lines and self aligned shallow trench isolation structures and protruding floating gate structures in some embodiments according to the invention.

FIG. 14 is a perspective view and illustrates the non-volatile memory device including buried bit lines with self aligned shallow trenched isolation (STI) structures with gate structures 190 protruding into the substrate 100. According to FIG. 14, the substrate 100 can be patterned to define groves therein, into which a gate insulating pattern 201 can be deposited. Subsequently, when the lower conductive pattern 202 is formed, a portion is deposited in the groove to provide a protruding portion of a floating gate structure 190 that extends into the substrate 100. Accordingly, a channel developed by the gate 190 may the reduced short channel effects using such a structure.

Figure 15:
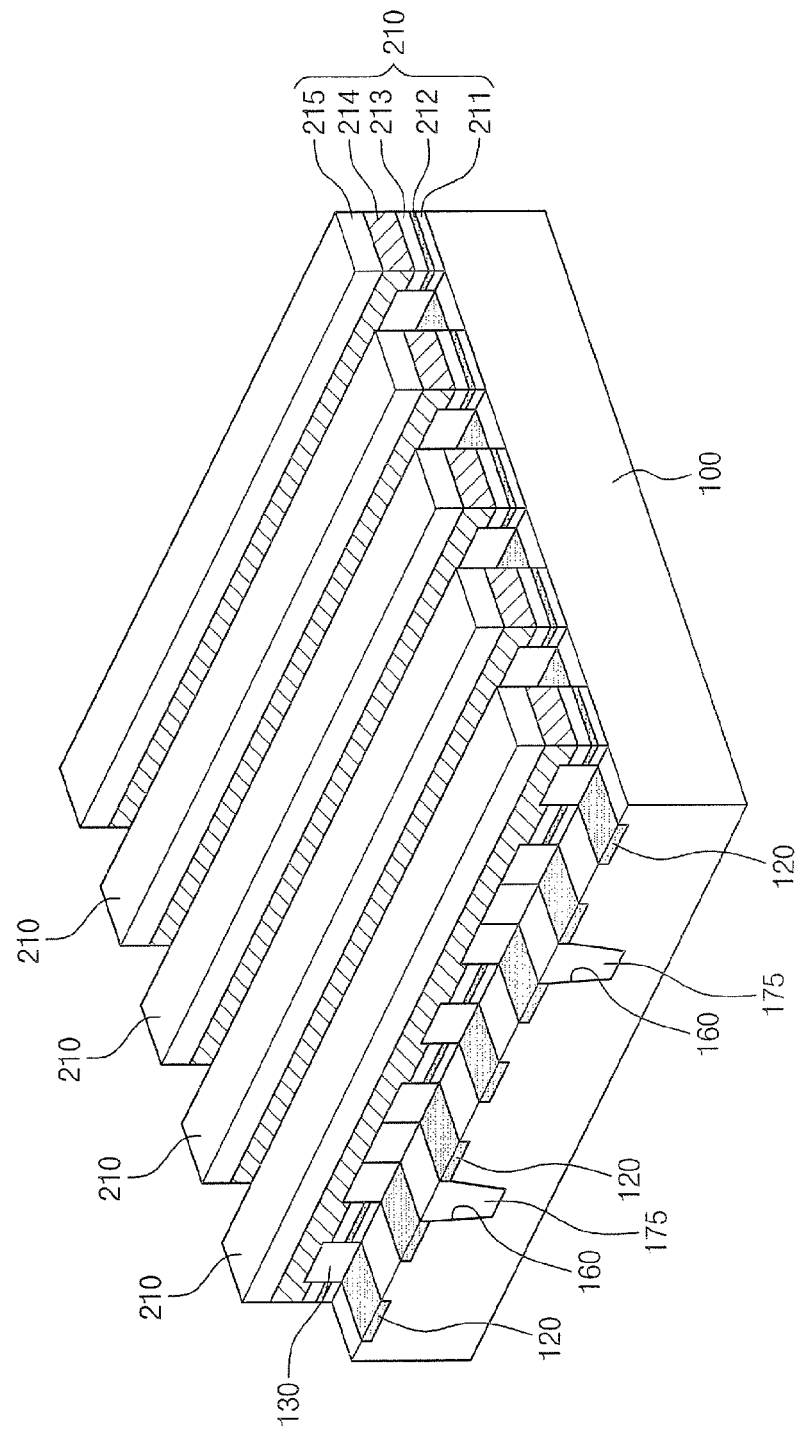
FIG. 15 is a perspective view of a flash memory including buried bit lines and self aligned shallow trench isolation structures with tunneling insulating patterns in some embodiments according to the invention.
Figure 16:
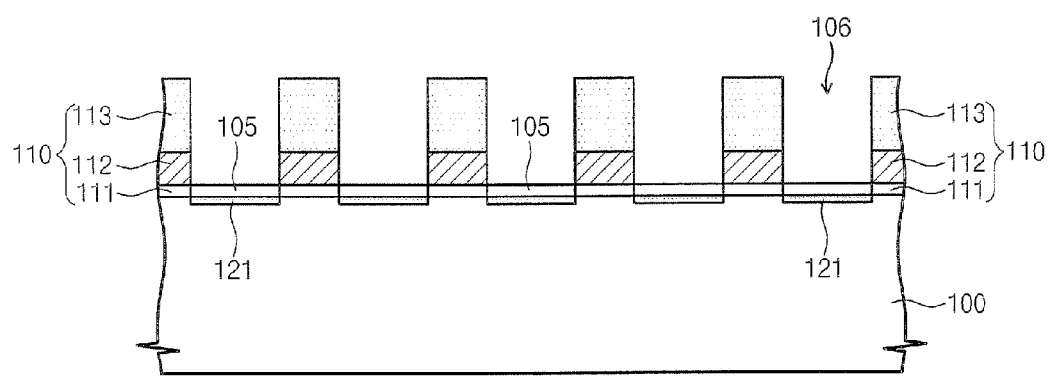
FIGS. 16-23 are cross-sectional views that illustrate methods of forming a NOR type flash memory including buried bit lines and self aligned shallow trench isolation structures with U-shaped floating gates in some embodiments according to the invention.

According to FIG. 15, the gate pattern 210 is formed on the substrate 100. The gate pattern 210 can include a tunnel insulating pattern 211 formed to a thickness of about 30 to about 100 Å. In some embodiments according to the invention, the tunnel insulating pattern can be $SiO_2$, SiON, $Si_xN_y$, $Al_2O_3$, HfAlON, HfSiO$_x$, and/or HfSiON. In some embodiments according to the invention, the gate pattern 210 includes a charge storage pattern 212 formed on the tunnel insulating pattern 211. The charged storage pattern can be formed to a thickness of about 30 to about 100 Å and can be $Si_xN_y$, $Al_2O_3$, HfAlO$_x$, HfAlON, HfSiO$_x$, and/or HfSiON. The gate pattern 210 can also include a blocking insulating pattern 213 formed on the charge storage pattern 212. The blocking insulating pattern 213 can be formed to a thickness of about 50 to about 200 Å and can be made from SiOx/SixNy/SiOx, SiOx, SixNy, Al2O3, HfAlOx, HfAlON, HfSiOx, and/or HfSiON. Further, the gate pattern 210 can include a control gate pattern 214 formed on the blocking insulating pattern 213. The control gate pattern 214 can be formed of a metal that has a work function of at least four electron volts (eE). In some embodiments according to the invention, the metal used to provide the control gate pattern 214 can be, TaN, W, WN, Ti, TiN, Ta, Hf, Nb, Mo, $RuO_2$, $Mo_2N$, Ir, Pt, Co, Cr, RuO, and/or $Ti_3Al$.

FIGS. 16-23 are cross sectional views that illustrate methods of forming a non-volatile memory including buried bit lines and self aligned shallow trench isolation structures with U shaped floating gate electrodes in some embodiments according to the invention. According to FIG. 16, the lower pattern 110 is formed on the substrate 100 including openings 106 to expose underlying portions of the substrate 100. First impurities are implanted into the substrate 100 via the openings 106 to form lightly doped regions 121.

Figure 17:
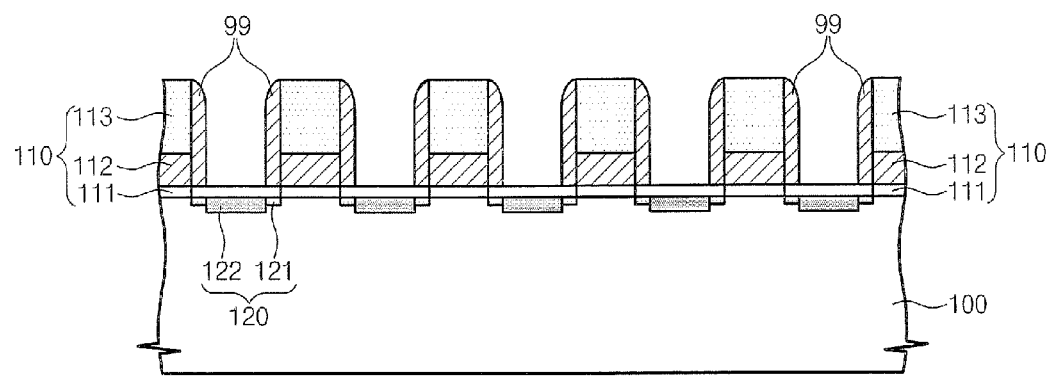

According to FIG. 17, a side wall spacer pattern 99 is formed on side walls of the lower pattern 110 in the openings 106. Subsequently, second impurities are implanted into the substrate 100 through the openings 106 having the spacer pattern 99 formed therein to form a highly doped region 122 in the substrate 100. Accordingly, the lightly doped region 121 located beneath the side wall spacer pattern 99 is maintained in the substrate 100. In some embodiments according to the invention, the material used to form the spacer pattern 99 can be the same material used to form the lower conductive pattern 112. It will be understood that the lightly doped region 121 and the more highly doped region 122, taken together, can provide the impurity region 120 described above.

Figure 18:
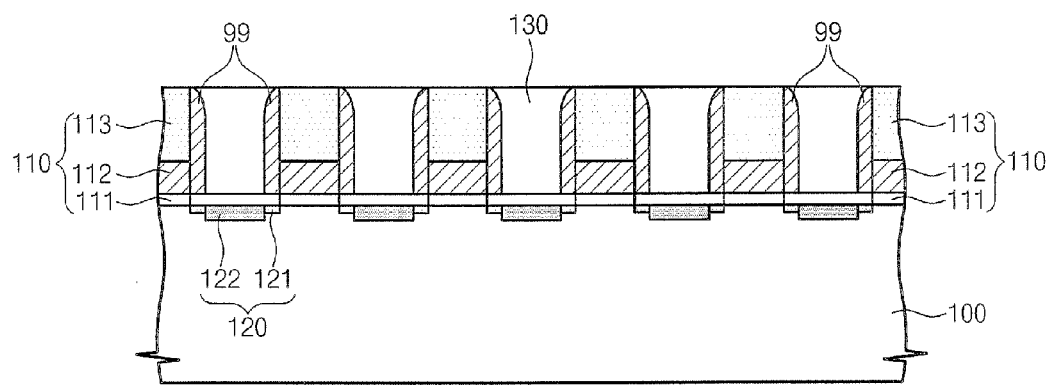
Figure 19:
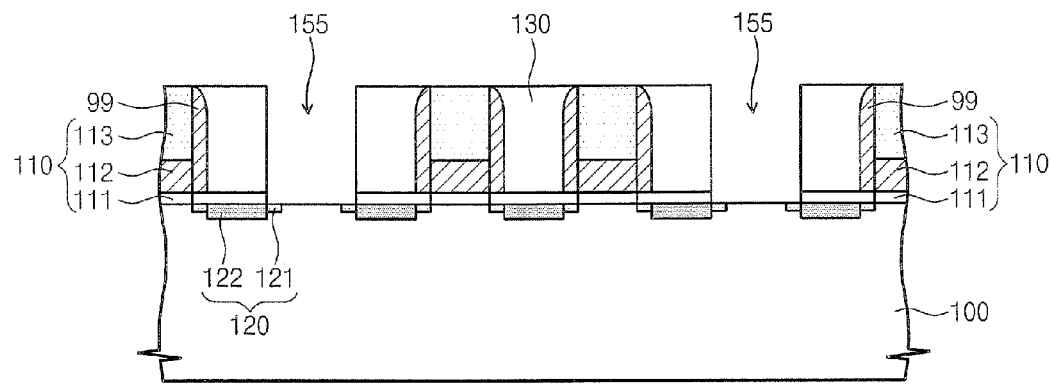

According to FIG. 18, a lower interlayer dielectric layer 130 is formed in the openings 106 between the spacer pattern 99. According to FIG. 19, selective structures within the lower patter 110 are removed as described above in reference to, for example, FIGS. 7 and 8, to provide self aligned trenches 160 in the substrate 100 that are self aligned to the side walls of the lower interlayer dielectric 130.

Figure 20:
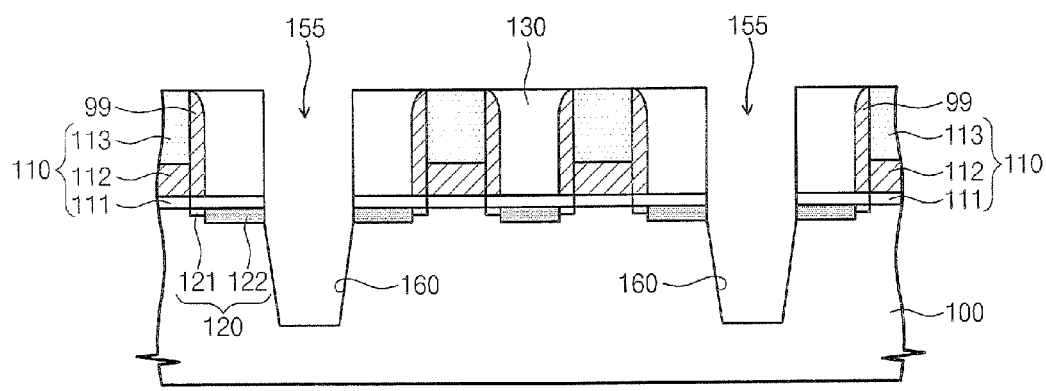
Figure 21:
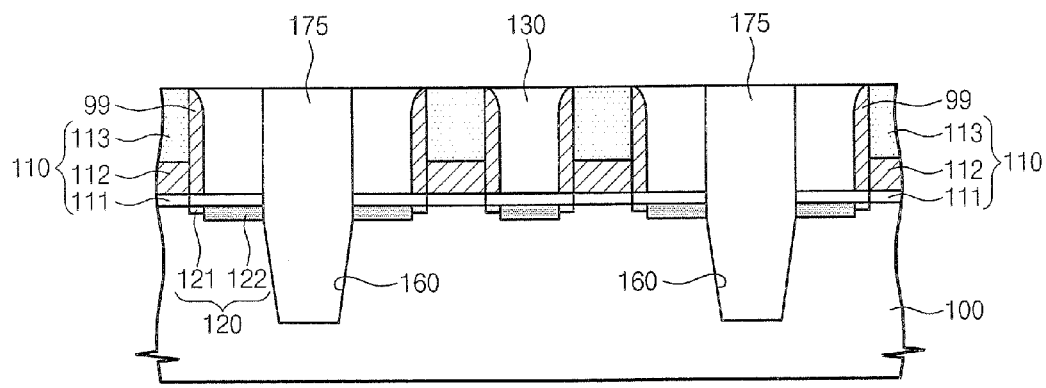

According to FIG. 21, a shallow trench isolation material 175 is formed in the self aligned trench 160 to provide the self aligned shallow trench isolation structures 175 that are self aligned to the side walls of the interlayer dielectric layer 130 exposed by the formation of the self aligned trenches 160 shown in FIG. 20.

Figure 22:
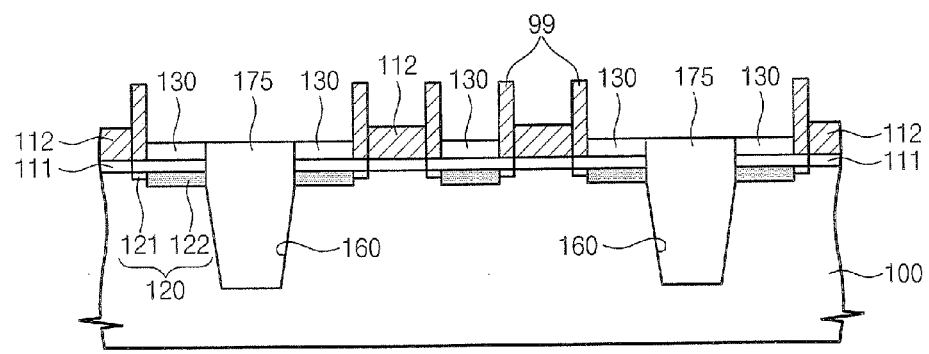

According to FIG. 22, the capping pattern 113 is removed and the lower inter layer dielectric 130 is recessed to expose side walls of the lower conductive pattern 112 defined by the side wall spacer pattern 99. Therefore, according to FIG. 22, the side wall spacer pattern 99 and the lower conductive pattern 112 combine to provide a U shaped floating gate electrode for the non volatile memory.

Figure 23:
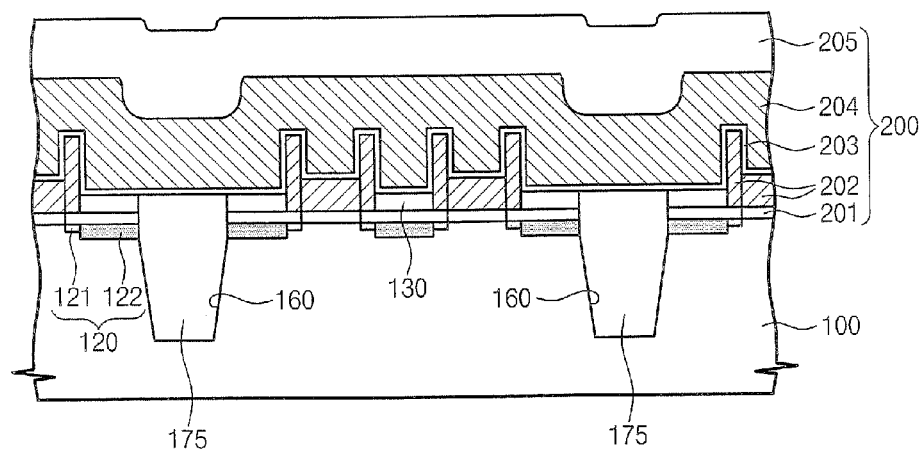

According to FIG. 23, an upper pattern is formed on the U shaped floating gate electrode including an inter gate dielectric layer 203, a control gate pattern 204, and a passivation layer 205, which together provide the upper layer 200.

Figure 24A:
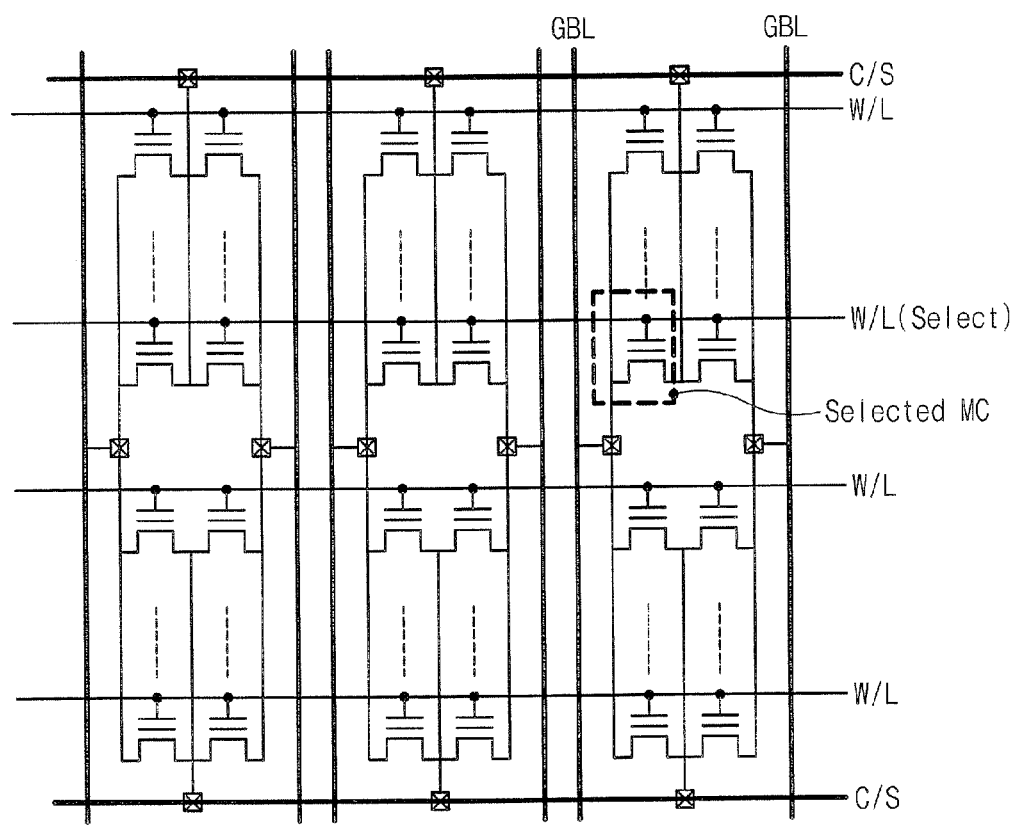
FIG. 24A is a schematic illustration of an equivalent circuit of a NOR type flash memory array formed according to some embodiments of the present invention.

FIG. 24A shows a schematic illustration of an equivalent circuit including the neighboring memory cells (MC) described above in reference to FIG. 1. Further, FIG. 24B includes a table that illustrates nominal parameters associated with operations of the memory cell (MC) shown in FIG. 24A.

Figure 25:
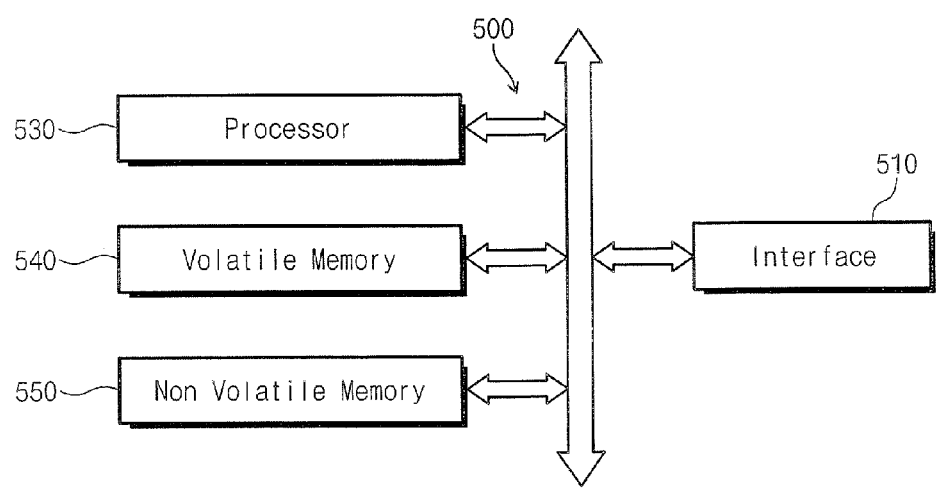
FIG. 25 is a block diagram illustrating memory cards and/or systems including various components and non-volatile memory with NOR type flash memory devices formed according to some embodiments of the present invention.

FIG. 25 is a schematic representation of an electronic system 560 including a processor circuit 530 that is configured to coordinate overall operation of the electronic system 560 via a bus 500 that is coupled to a volatile memory system 540, an interface system 510, and a nonvolatile memory system 550. The nonvolatile memory system 550 can include memory devices, such as memory cards and separate non-volatile memory devices as described herein and including self-aligned shallow trench isolation structures in some embodiments according to the invention and as described herein.

As described herein, shallow trench isolation structures can be formed self aligned to, for example, impurity regions that provide the buried bit line structures and NOR type flash memories. In particular, forming the shallow trench isolation structures so that they are self aligned to structures that provide the buried bit line of the non-volatile memory (i.e., the impurity regions) can help to substantially equalize ranks of the associated impurity regions (i.e., the lengths of the bit lines). For example, the formation of the self aligned shallow trench isolation structures can help to remove portions of the impurity regions which may have otherwise been formed misaligned by a conventional photolithographic process. As appreciated by the present inventors, using a photolithographic process to form the shallow trench isolation structures separate from the formation of the impurity regions to provide the buried bit lines can lead to misalignment errors thereby increasing the possibility of forming bit lines with different lengths within the same memory sector.

In further embodiments according to the invention, the impurity regions can be formed before the shallow trench isolation structures. In particular, the impurity regions may be formed in the substrate to provide immediately neighboring buried bit lines for the device. After the formation of the impurity region (i.e., the buried bit lines), a shallow trench isolation region can be formed in the substrate between the immediately neighboring buried bit lines. As appreciated by the present inventors, this approach can substantially equalize what may be otherwise different lengths of the immediately neighboring buried bit lines, which may be generated by conventional approaches. For example, as appreciated by the present inventors, if the shallow trench isolation structure is formed in the substrate using a standard photolithographic process (e.g., before the formation of the impurity regions), the subsequent formation of the impurity regions can be misaligned relative to the shallow trench isolation structures previously formed. Accordingly, this misalignment can lead to impurity regions (ultimately providing the buried bit lines) having different lengths.

It will be apparent to those skilled in the art that various modifications and variations can be made in the invention. Thus, it is intended that the invention covers the modifications and variations of this invention provided they come within the scope of the appended claims and their equivalents.

What is claimed:

1. A method of forming buried bit lines in a non-volatile memory device comprising:
   forming impurity regions in a substrate of a non-volatile memory device to provide immediately neighboring buried bit lines for the device; and then
   forming a shallow trench isolation region of a line shape in the substrate between the immediately neighboring buried bit lines to substantially equalize lengths of the immediately neighboring buried bit lines; and
   forming a control gate pattern providing a word line, the control gate pattern crossing over the shallow trench isolation region and the buried bit lines.

2. The method according to claim 1 wherein the immediately neighboring buried bit lines comprise respective buried bit lines for immediately neighboring pairs of memory cells electrically coupled to separate local bit lines.

3. A method of forming a non-volatile memory device comprising:
   forming a lower pattern on a substrate including a plurality of openings through which the substrate is exposed,
   implanting impurities into the substrate through the openings to form a plurality of impurity regions in the substrate to provide a plurality of buried bit lines for the non-volatile memory device;
   forming dielectric layers on the impurity regions;

forming a mask pattern on the lower pattern including openings therein above regions of the substrate between ones of the plurality of impurity regions having the dielectric layers thereon;

forming self-aligned trenches in the regions self-aligned to side walls of the dielectric layers on the ones of the impurity regions, wherein portions of the impurity regions separated by the self-aligned trenches are removed to substantially equalize respective lengths of remaining portions of the impurity regions;

forming an isolation layer in the self-aligned trenches to provide a plurality of self-aligned shallow trench isolation structures of a line shape self-aligned to and on the side walls of the dielectric layers; and forming a control gate pattern providing over the shallow trench isolation region and the buried bit lines.

4. The method according to claim 3 wherein forming a lower pattern comprises forming a gate insulating pattern, then forming a lower conductive pattern, then forming a capping pattern, the method further comprising:

removing the capping pattern to expose the lower conductive pattern; and recessing the dielectric layers on the impurity regions to expose side walls of the lower conductive pattern, wherein forming a control gate pattern comprises forming an upper layer on the lower conductive pattern including an inter-gate dielectric layer, an upper conductive layer, and an upper hardmask layer, and patterning the upper layer to provide a plurality of word lines for the non-volatile memory device.

5. The method according to claim 3 wherein forming a lower pattern comprises:

forming grooves in regions of the substrate where the lower conductive patterns are to be formed for the non-volatile memory device; and forming the lower conductive pattern in the grooves to provide a plurality of floating gates comprising protruding portions that extend into the substrate.

6. The method according to claim 3 wherein forming a lower pattern comprises:

forming a tunneling insulating pattern; then forming a charge storage pattern; and then forming a blocking insulating pattern.

7. The method according to claim 6 wherein:

forming the tunneling insulating pattern comprises forming the tunneling insulating pattern to a thickness of about 30 Angstroms to about 100 Angstroms comprising $SiO_2$, SiON, $Si_xN_y$, $Al_2O_3$, HfAlON, $HfSiO_x$, and/or HfSiON;

forming the charge storage pattern comprises forming the charge storage pattern to a thickness of about 30 Angstroms to about 100 Angstroms comprising $Si_xN_y$, $Al_2O_3$, $HfAlO_x$, HfAlON, $HfSiO_x$, HfSiON;

forming the blocking insulating pattern comprises forming the blocking insulating pattern to a thickness of about 50 Angstroms to about 200 Angstroms comprising SiOx/SixNy/SiOx, SiOx, SixNy, Al2O3, HfAlOx, HfAlON, HfSiOx, and/or HfSiON;

wherein the control gate pattern comprises a metal having a work function of at least about 4 eV.

8. The method according to claim 6 wherein forming a control gate pattern comprises forming the control gate pattern comprising TaN, W, WN, Ti, TiN, Ta, Hf, Nb, Mo, $RuO_2$, $Mo_2N$, Ir, Pt, Co, Cr, RuO, and/or $Ti_3Al$.

9. The method according to claim 3 wherein implanting into the substrate through the openings to form a plurality of impurity regions in the substrate comprises implanting first impurities into the substrate through the openings to form a plurality of lightly doped impurity regions in the substrate; then forming side wall spacers on side walls of the openings in the lower pattern, the method further comprising:

implanting second impurities through the openings having the side wall spacers thereon to form more highly doped impurity regions in the substrate immediately neighboring the lightly doped impurity regions to provide the impurity regions including the lightly and more highly doped impurity regions.

10. The method according to claim 3 further comprising:

wherein forming a lower pattern comprises forming a gate insulating pattern, then forming a lower conductive pattern, then forming a capping pattern, the method further comprising:

removing the capping pattern to expose the lower conductive pattern;

recessing the dielectric layers on the impurity regions to expose side walls of the lower conductive pattern comprising the side wall spacers to provide a U-shaped floating gate pattern for the gate structures; and forming an upper layer on the U-shaped floating gate including an inter-gate dielectric layer and a control gate.

11. A method of forming a non-volatile memory device comprising:

forming a lower pattern on a substrate including a plurality of openings through which the substrate is exposed, comprising forming a gate insulating pattern, a lower conductive pattern, and a capping pattern;

implanting impurities into the substrate through the openings to form a plurality of impurity regions in the substrate to provide a plurality of buried bit lines for the non-volatile memory device;

forming dielectric layers on the impurity regions;

forming a mask pattern on the lower pattern including openings therein above regions of the substrate between ones of the plurality of impurity regions having the dielectric layers thereon;

forming self-aligned trenches in the regions self-aligned to side walls of the dielectric layers on the ones of the impurity regions, wherein portions of the impurity regions separated by the self-aligned trenches are removed to substantially equalize respective lengths of remaining portions of the impurity regions;

forming an isolation layer in the self-aligned trenches to provide a plurality of self-aligned shallow trench isolation structures of a line shape self-aligned to the side walls of the dielectric layers;

removing the capping pattern to expose the lower conductive pattern;

recessing the dielectric layers on the impurity regions to expose side walls of the lower conductive pattern;

forming an upper layer on the lower conductive pattern including an inter-gate dielectric layer, an upper conductive layer, and an upper hardmask layer; and patterning the upper layer to provide a plurality of word lines for the non-volatile memory device, wherein the word lines crosses over the shallow trench isolation region and the buried bit lines.

12. The method according to claim 11 wherein the non-volatile memory device comprises a NAND flash memory device or a NOR flash memory device.

* * * * *